(12) United States Patent
Park

(10) Patent No.: US 6,642,626 B2
(45) Date of Patent: Nov. 4, 2003

(54) BALL GRID ARRAY IC PACKAGE AND MANUFACTURING METHOD THEREOF

(75) Inventor: Sang Wook Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/024,888

(22) Filed: Dec. 18, 2001

(65) Prior Publication Data

US 2002/0185746 A1 Dec. 12, 2002

(30) Foreign Application Priority Data

Jun. 12, 2001 (KR) ........................................ 2001-32872

(51) Int. Cl.[7] ........................... H01L 23/48; H01L 21/44
(52) U.S. Cl. ........................................ 257/778; 438/108
(58) Field of Search ................................. 257/734, 737, 257/738, 772, 777, 778, 779, 786; 438/106, 108, 109, 117

(56) References Cited

U.S. PATENT DOCUMENTS

| | | | |
|---|---|---|---|
| 5,284,796 A | * | 2/1994 | Nakanishi et al. .......... 437/183 |
| 6,075,710 A | | 6/2000 | Lau |
| 6,153,938 A | | 11/2000 | Kanda et al. |
| 6,184,062 B1 | * | 2/2001 | Brofman et al. ............. 438/106 |
| 6,559,527 B2 | * | 5/2003 | Brofman et al. ............. 257/678 |

FOREIGN PATENT DOCUMENTS

| | | | |
|---|---|---|---|
| JP | 3-30349 A | * 2/1999 | .......... H01L/21/60 |
| JP | 003979 | 1/2000 | |
| JP | 150697 | 5/2000 | |
| JP | 164632 | 6/2000 | |

* cited by examiner

Primary Examiner—Kamand Cuneo
Assistant Examiner—Scott B. Geyer
(74) Attorney, Agent, or Firm—Ladas & Parry

(57) ABSTRACT

A ball grid array IC package and manufacturing method thereof comprise spherical conductive balls that are changed into a shape having an hourglass type feature. A semiconductor chip having a plurality of chip pads, a substrate having ball lands, hourglass type conductive balls electrically connected to the chip pads and to the ball lands, and an interval maintaining member maintaining a uniform interval between the semiconductor chip and substrate. The method includes a heat treatment that expands the interval maintaining member to provide a uniform width between the surface of the chip and the substrate so that the conductive balls change into the hourglass shape, after which removal of the heat treatment decreases the size of the interval maintaining member so that the physical separation between the surfaces is provided by the connecting members having the hourglass shapes.

21 Claims, 8 Drawing Sheets

BALL GRID ARRAY IC PACKAGE AND MANUFACTURING METHOD THEREOF

BACKGROUND OF THE INVENTION

1. Field of the Invention

The present invention relates generally to a semiconductor or integrated circuit (IC) package and manufacturing method thereof, and more particularly, to a ball grid array package and manufacturing method thereof for providing an IC package in which leads comprising spherical conductive balls are changed into an hourglass type features.

2. Description of the Related Art

Generally, a ball grid array for an IC package uses conductive balls, such as solder balls and the like, which are arranged on a back surface of a substrate, to provide external leads. As a result, ball grid array packages provide a reduction in IC size, and further reduces the occurrence of lead deformation, unlike QFP (Quad Flat Package) packages.

FIG. 1A illustrates a cross-sectional view of a ball grid array package according to a first embodiment of a conventional IC package, and FIG. 1B illustrates a cross-sectional view of a ball grid array package according to a second embodiment of a conventional IC package.

Generally, ball grid array IC packages having the above-mentioned advantages are divided into two types, a vessel type having conductive balls 114 resembling a ship feature as shown in FIG. 1A and an hourglass type having an hourglass shaped conductive balls 115 as shown in FIG. 1B, in accordance with conventional packages utilizing conductive balls 114, 115 mounted on a substrate 100.

A ball grid array package manufactured as either a vessel or hourglass type undergoes a reliance test against heat at a temperature of 200 to 250° C.

During the reliance test against heat at these temperatures, the conductive balls 114 of the vessel type ball grid package are metamorphosed from a spherical type into an elliptic type as shown in FIG. 1A. Stresses are generated from the interfaces among the conductive balls 114, a print circuit board (PCB, hereinafter called substrate) 100 in contact with the conductive balls 114, and a semiconductor chip 110 having a plurality of chip pads 112, which may result in formation of cracks in one or more of the contacting members.

In order to overcome the manufacturing problems of vessel type packages, an hourglass type ball grid array package having an excellent joint reliance for a solder joint and an excellent thermal reliance has been proposed. Unfortunately, the hourglass type package needs an additional process of pulling up a semiconductor chip in vacuum, which requires using additional equipment so as to metamorphose a conductive ball into an hourglass type cylinder.

SUMMARY OF THE INVENTION

Accordingly, the present invention is directed to a ball grid array IC package and manufacturing method thereof that substantially obviates one or more of the problems resulting from the limitations and disadvantages of the related art.

One object of the present invention is to provide a ball grid array package allowing metamorphosis of a conductive ball into an hourglass feature with ease by maintaining a uniform interval between a semiconductor chip and a substrate.

Another object of the present invention is to provide a method of manufacturing a ball grid array package allowing the metamorphosis of a conductive ball into an hourglass feature with ease by utilizing a member that provides a uniform interval between a semiconductor chip and a substrate.

Additional features and advantages of the invention will be set forth in the following detailed description, and in part will be apparent from the description, or may be learned by practice of the invention as herein disclosed. The objectives and other advantages of the invention will be realized and attained by the structure particularly pointed out in the written description and claims hereof as well as the appended drawings.

To achieve these and other advantages, and in accordance with the purpose of the present invention as embodied and broadly described, ball grid array IC packages according to the present invention include a semiconductor chip having a plurality of chip pads, a substrate having ball lands, hourglass type conductive balls electrically connected to the chip pads and landed at the ball lands, respectively, and an interval maintaining member maintaining a uniform interval between the semiconductor chip and substrate.

In another embodiment, a method of manufacturing ball grid array IC packages according to the present invention includes the steps of providing a semiconductor chip having a plurality of chip pads, attaching spherical conductive balls and an expansive interval maintaining member on the chip pads, mounting the conductive balls on the ball lands, and expanding a volume of the interval maintaining member by carrying out thermal treatment on the resultant so as to change the spherical conductive balls into shapes including hourglass features.

In a further embodiment, a method of manufacturing ball grid array IC packages according to the present invention includes the steps of providing a semiconductor chip having a plurality of chip pads, forming spherical conductive balls on the chip pads, forming ball lands and an expansive interval maintaining member on a substrate, mounting the conductive balls on the ball lands, and expanding a volume of the interval maintaining member by carrying out thermal treatment on the resultant structure so as to change the spherical conductive balls into shapes having hourglass features.

It is to be understood that both the foregoing general description and the following detailed description are exemplary and explanatory and are intended to provide further explanation of the invention as described and as claimed herein.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1A:
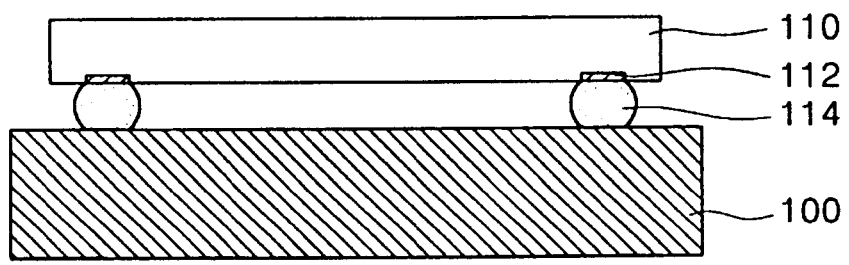
FIG. 1A illustrates a cross-sectional view of a ball grid array IC package according to a first conventional embodiment found in the related art.
Figure 1B:
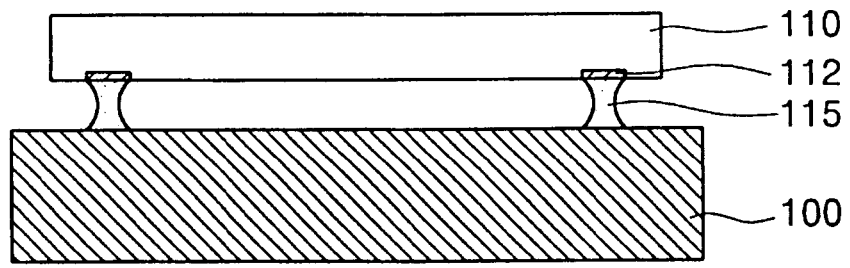
FIG. 1B illustrates a cross-sectional view of a ball grid array package according to a second conventional embodiment found in the related art.

Reference will now be made in detail to the preferred embodiments of the present invention, examples of which are illustrated in the accompanying drawings. Where possible, the same reference numerals will be used to illustrate like elements throughout the several embodiments of the specification.

Figure 2:
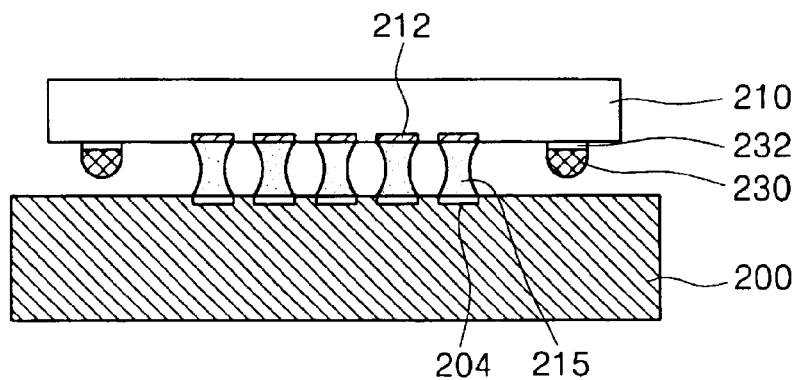
FIG. 2 illustrates a cross-sectional view of a ball grid array package according to a first embodiment of the present invention.
Figure 3A:
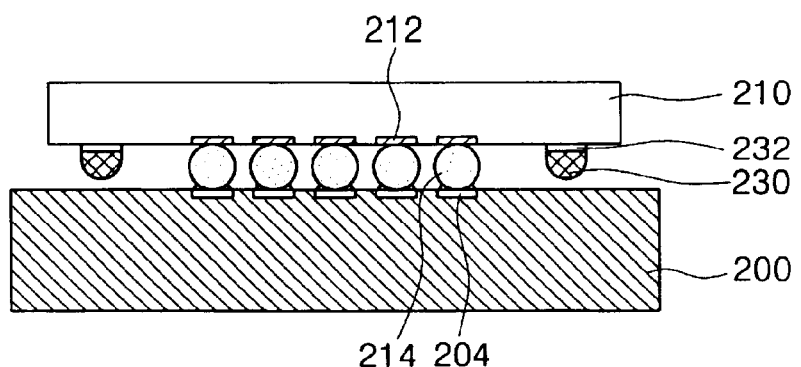
FIGS. 3A to 3D illustrate cross-sectional views showing the steps for manufacturing a ball grid array IC package according to a first embodiment of the present invention.
Figure 3B:
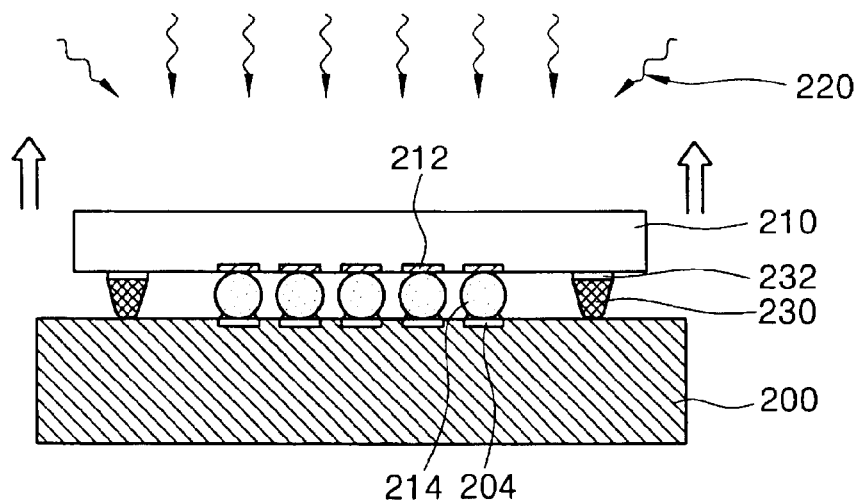
Figure 3C:
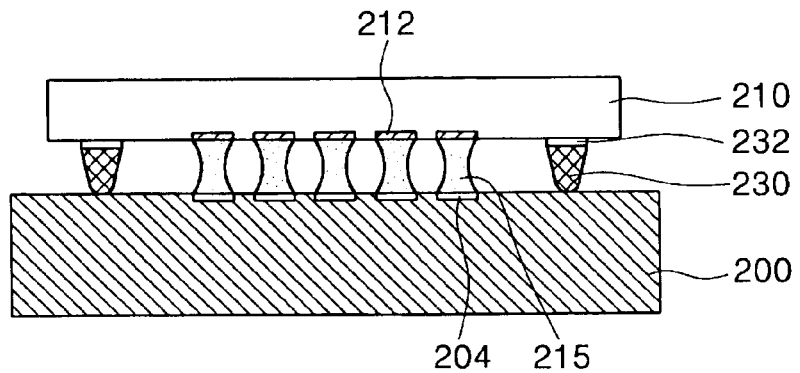
Figure 3D:
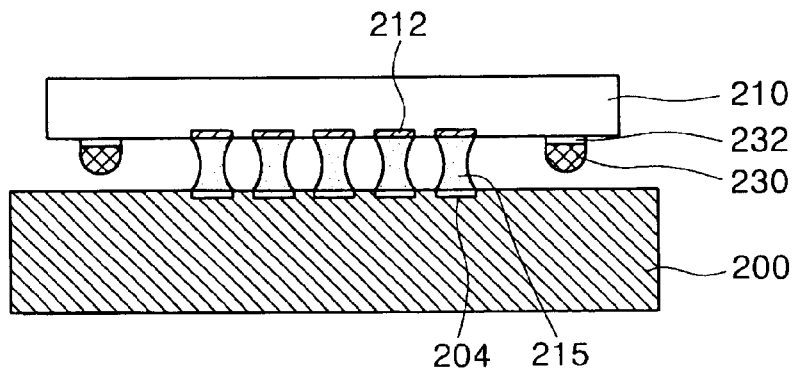
Figure 4:
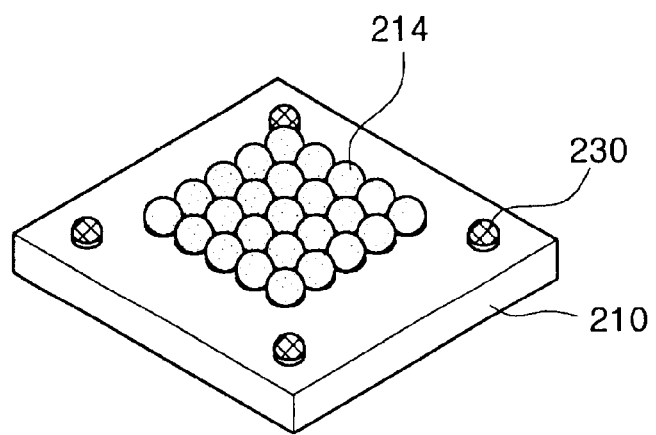
FIG. 4 illustrates a perspective view of a semiconductor chip having chip pads at a central part thereof according to a first embodiment of the present invent ion.

FIGS. 2 to 7 illustrate a ball grid array IC package and manufacturing method thereof according to a first embodiment of the present invention. FIG. 2 illustrates a cross-sectional view of a ball grid array IC package according to a first embodiment of the present invention. FIGS. 3A to 3D illustrate cross-sectional views of manufacturing a ball grid array IC package according to a first embodiment of the present invention. FIG. 4 illustrates a perspective view of a semiconductor chip having chip pads at a central part thereof according to a first embodiment of the present invention, and FIGS. 5A and 5B illustrate a process of manufacturing a spherical polymer ball.

Figure 6:
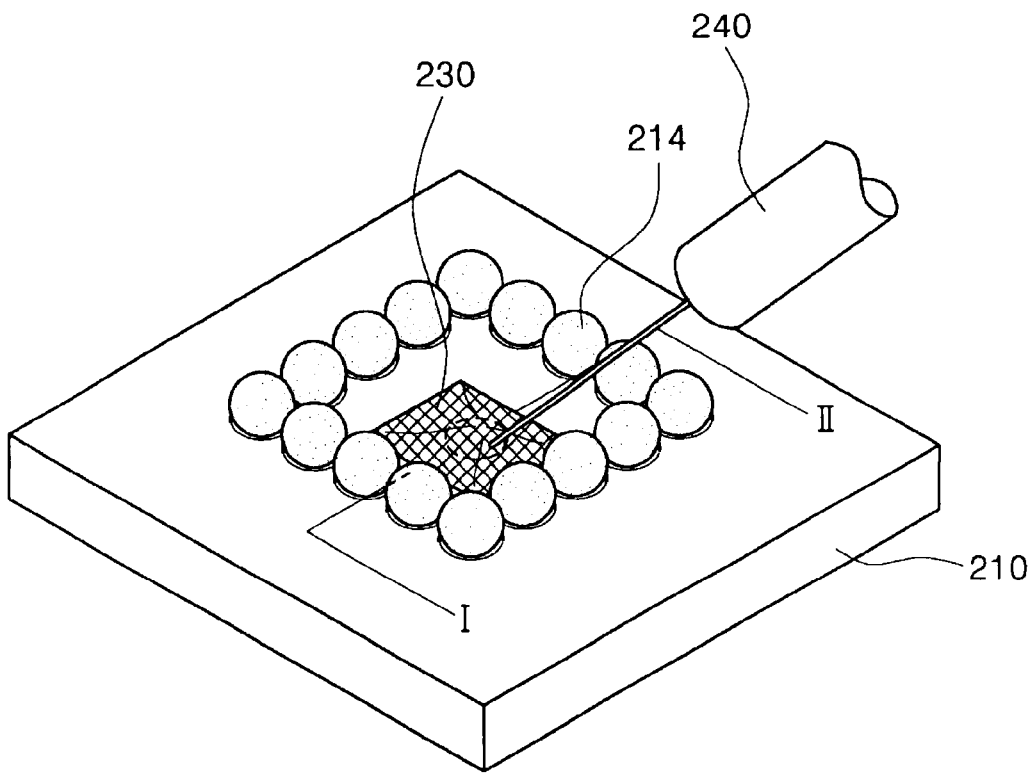
FIG. 6 illustrates a perspective view of a semiconductor chip having chip pads at a circumference thereof.
Figure 7:
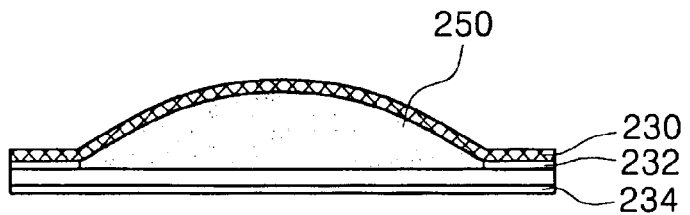
FIG. 7 illustrates a cross-sectional view taken approximately along a line I–II extending through the semiconductor chip of FIG. 6.

FIG. 6 illustrates a perspective view of a semiconductor chip having chip pads at a circumference thereof according to a first embodiment of the present invention and FIG. 7 illustrates a cross-sectional view taken approximately along the line I–II of FIG. 6.

Referring again to FIG. 2, a ball grid array IC package according to a first embodiment of the present invention is constructed with a semiconductor chip 210 having a plurality of chip pads 212, hourglass type conductive balls 215 electrically connected to the chip pads 212, a substrate 200 having ball lands 204 on which the conductive balls 215 are mounted, polymer balls 230 formed on the semiconductor chip 210 for maintaining a uniform interval between the semiconductor chip 210 and substrate 200 to make the conductive balls 215 hourglass type, and an adhesive layer 232 disposed between the semiconductor chip 210 and the polymer balls 230.

When the chip pads 212 are arranged at a central part of the semiconductor chip 210, as shown in FIG. 4, the polymer balls 230 are arranged at a peripheral part of the semiconductor chip 210, where the chip pads 212 are not disposed. On the other hand, when the chip pads 212 are arranged at the peripheral part of the semiconductor chip 210, as shown in FIG. 6, the polymer balls 230 are arranged at the central part of the semiconductor chip 210, where the chip pads 212 are not disposed.

In a method of manufacturing the ball grid array IC package according to the first embodiment of the present invention, shown in FIG. 3A, spherical conductive balls 214 are formed on chip pads 212 of a semiconductor chip 210. Preferably, the conductive balls 214 are solder balls having a spherical shape.

Polymer balls 230 are attached to the semiconductor chip 210 using an adhesive layer 232. The adhesive layer 232 may comprise an adhesive tape, an adhesive agent or other appropriate adhesive member.

The polymer balls 230 shown in FIG. 7 are attached to the semiconductor chip 210 by the adhesive layer 232 and a tape 234 or the like, and are thereby sealed and isolated completely from the outer atmosphere. The polymer balls 230 preferably are formed of an epoxy based resin or a polyimide based resin.

In FIGS. 3A to 3D, the chip pads 212 and the conductive balls 214 are arranged at the central part of the semiconductor chip 210, while the polymer balls 230 are arranged at the peripheral part of the semiconductor chip 210. Conversely, the chip pads 212 and the conductive balls 214 may be arranged at the peripheral part of the semiconductor chip 210, while the polymer balls 230 are arranged at the central part of the semiconductor chip 210, as shown in FIG. 6.

Figure 5A:
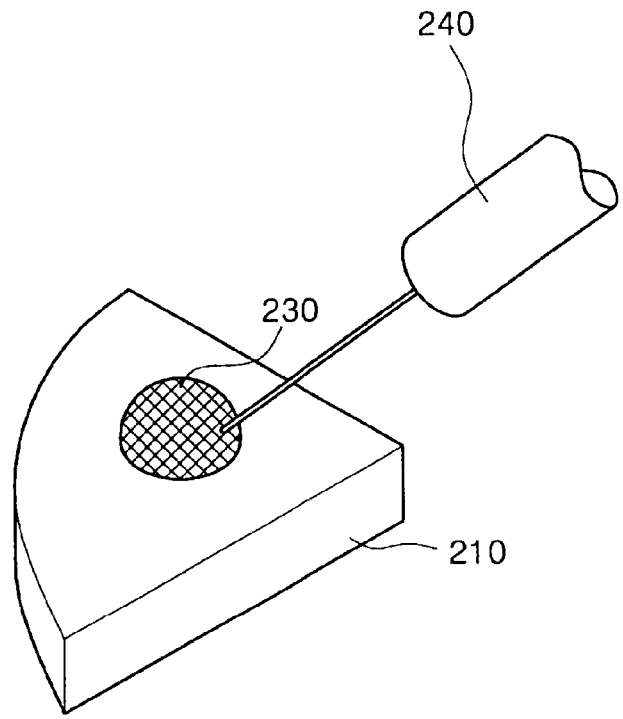
FIG. 5A and FIG. 5B illustrate the process steps of manufacturing a spherical polymer ball.
Figure 5B:
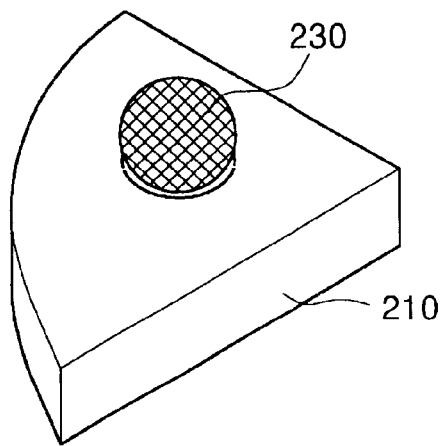

As shown in FIG. 5A and FIG. 7, the respective polymer balls 230) are charged with one of air, gas, water, oil or like material 250 using an injector 240, such as a piston or the like, whereby the volume of the respective polymer balls 230 are expanded, as shown in FIG. 5B. Alternatively, the polymer balls 230 may be charged with any material having expansion/contraction properties, depending on a temperature expansion variance instead of the above-described air, gas, water, and oil.

Referring now to FIGS. 3A to 3D, a metal has been deposited on the substrate 200. Ball lands 204 are provided by etching the metal so as to provide portions of the metal, corresponding to the chip pads 212, on the semiconductor chip 210. The conductive balls 214 are then disposed on the ball lands 204 of the substrate 200.

Referring now to FIG. 3B, a thermal treatment is carried out on the above resultant structure using an infrared lamp, shown as arrows 220. In this case, the thermal treatment is preferably carried out at a temperature of between 200 to 250° C., and more preferably, at a temperature of about 235° C.

As a result of the thermal treatment, the volume of each of the polymer balls 230 charged with one of air, gas, water, oil or the like is expanded, whereby the polymer balls 230 come into contact with the substrate 200. Such contact applies a predetermined pressure to the substrate 200.

Consequently, a uniform interval between the semiconductor chip 210 and substrate 200 is obtained. he expanded polymer balls 230 maintain a predetermined interval between the semiconductor chip 210 and the substrate 200.

Referring now to FIG. 3C, the conductive balls 215 are reflowed by the thermal treatment so as to be metamorphosed into shapes having hourglass features.

Then, the infrared lamp (not shown) is turned off, as shown in FIG. 3D, whereby the polymer balls 230 contract because of a decrease in their volume as a result of the temperature drop.

After the hourglass type conductive balls 215 have been fabricated, the removal of the contact polymer balls 230 is optional.

Figure 8:
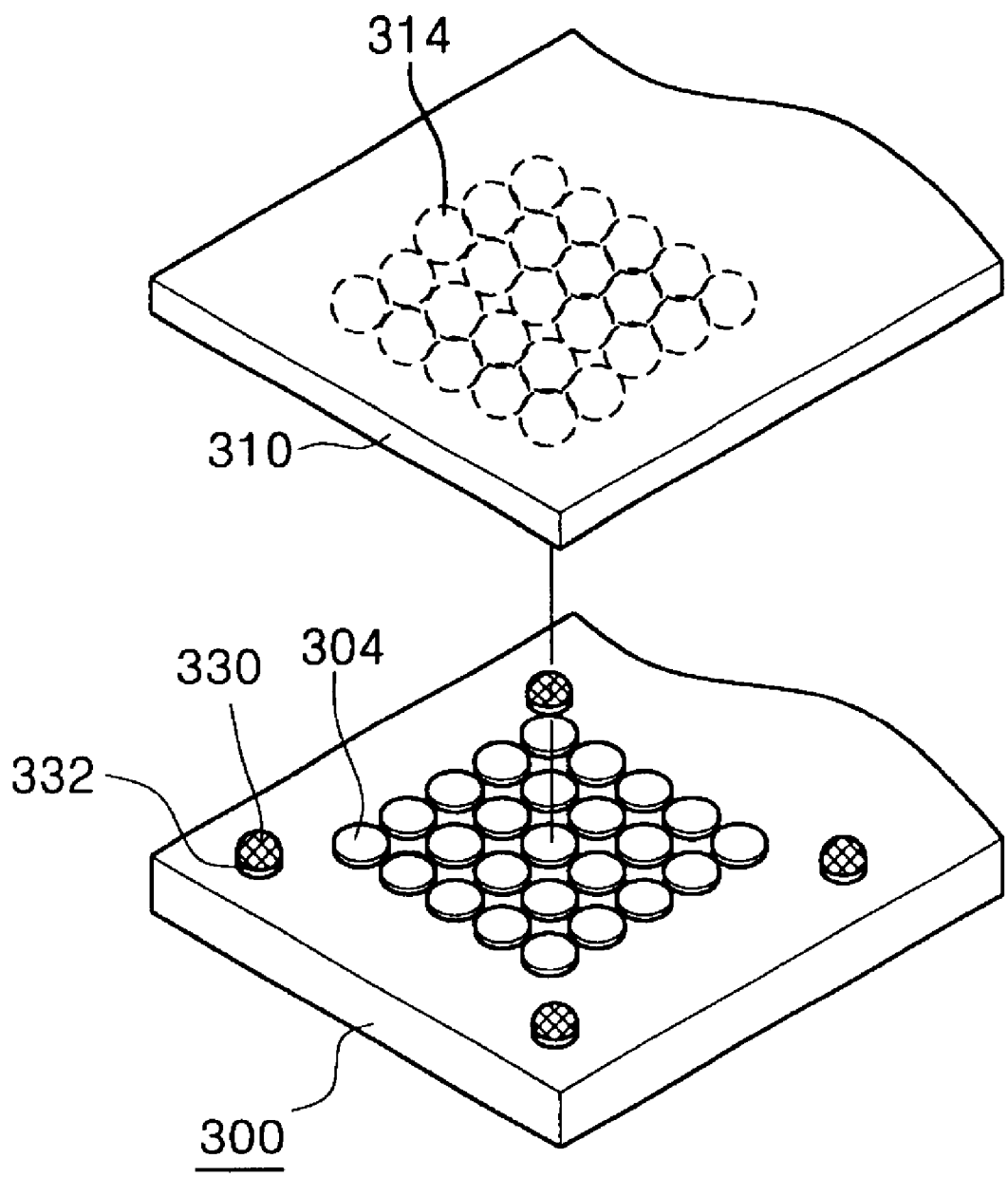
FIG. 8 illustrates an exploded perspective view of a ball grid array IC package according to a second embodiment of the present invention.

FIG. 8 illustrates an exploded perspective view of a ball grid array IC package according to a second embodiment of the present invention.

Referring to FIG. 8, a ball grid array IC package according to a second embodiment of the present invention is constructed with a semiconductor chip 310 having a plurality of chip pads (not shown), conductive balls 314 (shown in phantom) electrically connected to the chip pads, a substrate 300 having ball lands 304 on which conductive balls 314 are mounted, polymer balls 330, formed on those portions of the substrate 300 where the ball lands 304 are not formed, for maintaining a uniform interval between the semiconductor chip 310 and the substrate 300 so as to change the shape of the conductive balls 314 to ones having an hourglass type, and an adhesive layer 332 disposed between the substrate 300 and the polymer balls 330.

A method of manufacturing a ball grid array IC package according to the second embodiment of the present invention is almost the same as the first embodiment of the present invention except for polymer balls 330 being formed on a substrate 300.

The method of manufacturing a ball grid array package according to the second embodiment of the present invention is explained briefly as follows.

First, the spherical conductive balls 314 are attached to the chip pads (not shown) of the semiconductor chip 310. Polymer balls 330, as shown in FIG. 8, are then attached to those portions of the substrate 300 where ball lands 304 are not formed by inserting the adhesive layer 332 at a peripheral part.

Subsequently, the respective polymer balls 330 are charged with one of air, gas, water, oil or the like. The conductive balls 314 are then mounted on the ball lands 304 of the substrate 300.

Subsequently, thermal treatment is carried out on the above resultant structure. Maintaining a uniform interval between the semiconductor chip 310 and substrate 300 is achieved by the expansion of the polymer balls 330 to provide a uniform distance between the surfaces of the chip 310 and the substrate 300. The conductive balls 314 are reflowed by the thermal treatment so as to be metamorphosed into shapes having the hourglass features.

After the hourglass type conductive balls have been fabricated, the removal of the contact polymer balls 330 is optional, and alternatively, they are allowed to reduce their volume and size to be less than the height of the conductive members having the hourglass features.

Accordingly, in the first and second embodiments of the present invention, the spherical conductive balls are metamorphosed into shapes having the hourglass features using polymer balls having expansion/contraction properties depending on temperature variance by maintaining a uniform interval between the semiconductor chip and substrate.

Figure 9:
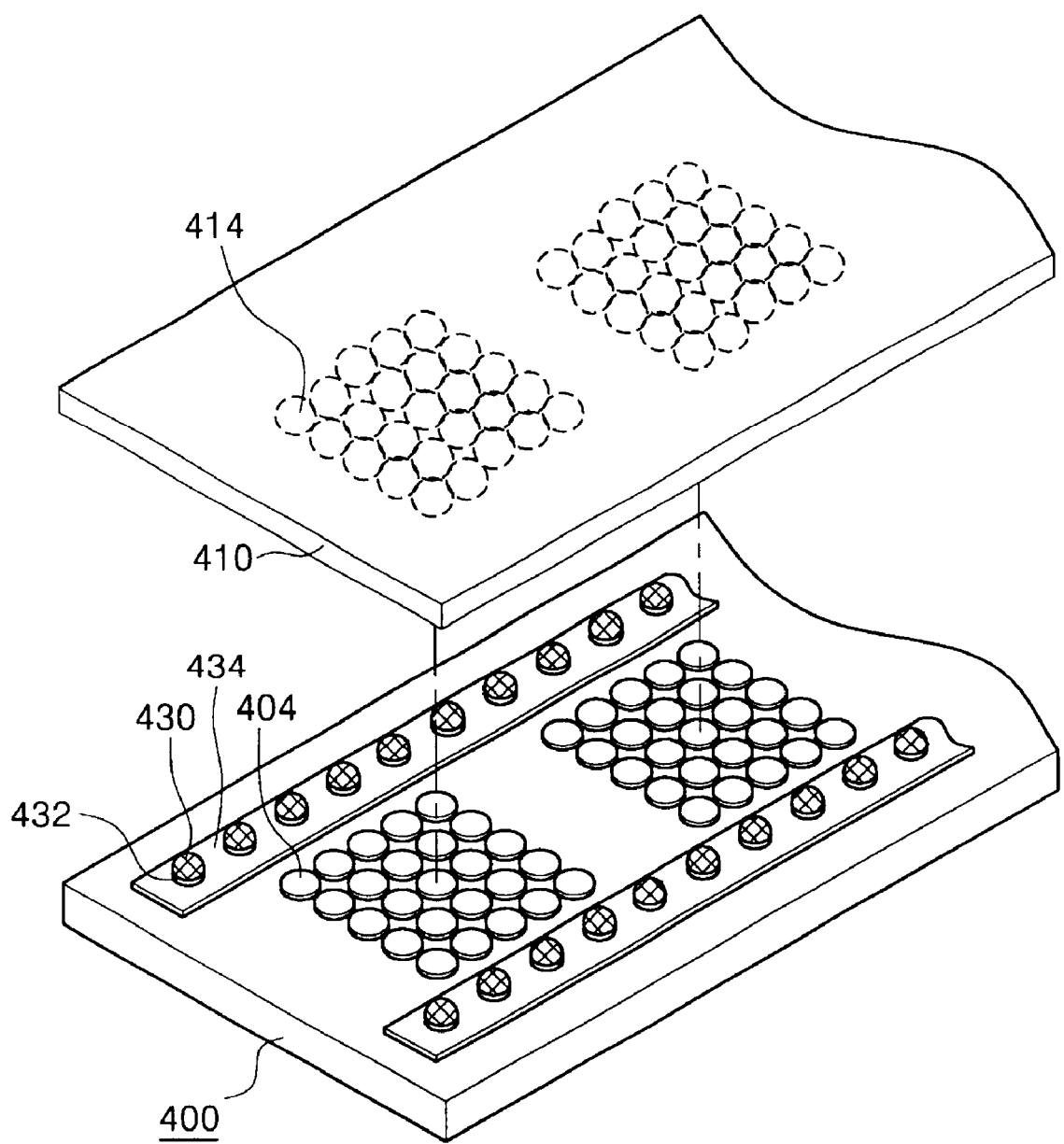
FIG. 9 illustrates an exploded perspective view of a ball grid array IC package according to a third embodiment of the present invention.
Figure 10:
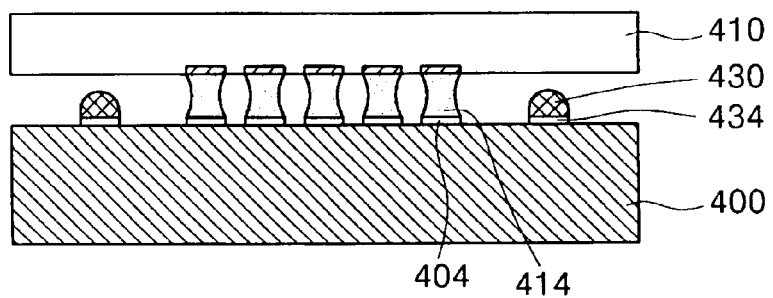
FIG. 10 illustrates a cross-sectional view of an assembled ball grid array IC package according to the third embodiment of the present invention.

FIG. 9 illustrates an exploded perspective view of a ball grid array IC package according to a third embodiment of the present invention, and FIG. 10 illustrates a cross-sectional view of a ball grid array IC package according to the third embodiment of the present invention.

Referring to FIG. 9, a ball grid array IC package according to a third embodiment of the present invention is constructed with a semiconductor chip 410 having a plurality of chip pads (not shown), conductive balls 414 (shown in phantom) electrically connected to the chip pads, a substrate 400 having ball lands 404 on which the conductive balls 414 are later mounted, a jig 434 attached to a peripheral part of the substrate 400 where the ball lands 404 are not formed, polymer balls 430 formed on the jig 434 for maintaining a uniform interval between the semiconductor chip 410 and the substrate 400 so as to make the conductive balls 414 have shapes of the hourglass type, and an adhesive layer 432 disposed between the semiconductor chip 410 and the polymer balls 430.

A method of manufacturing a ball grid array IC package according to the third embodiment of the present invention is shown in FIGS. 9 and 10. First, the conductive balls are formed on the chips pads of the semiconductor chip 410. After a metal has been deposited on the substrate 400 by known sputtering methods, ball lands 404 are provided by etching the metal so as to leave portions of the metal corresponding to the chip pads on the surface of substrate 400. A jig 434 is attached to a peripheral part of the substrate 400 where the ball lands 404 are not formed. In this case, the polymer balls 430 are arranged on the jig 434.

The adhesive layer 432 is disposed between the polymer balls 430 and the jig 434 so as to strengthen the adhesive power of the polymer ball attachment. Moreover, the polymer balls 430 are charged with any material having expansion/contraction properties depending on a temperature variance, for example, air, gas, water, oil or the like.

After the conductive balls 414 have come into contact with the ball lands 404, thermal treatment is carried out on the above resultant structure using an infrared lamp (not shown). As a result of the thermal treatment, the volume of each of the polymer balls 430 is expanded, whereby a uniform interval between the semiconductor chip 410 and substrate 400 is obtained. The conductive balls 414 are reflowed by the thermal treatment so as to be metamorphosed into connections having the hourglass features. Moreover, the jig 434 is detachable so as to be reused after the thermal treatment.

Figure 11:
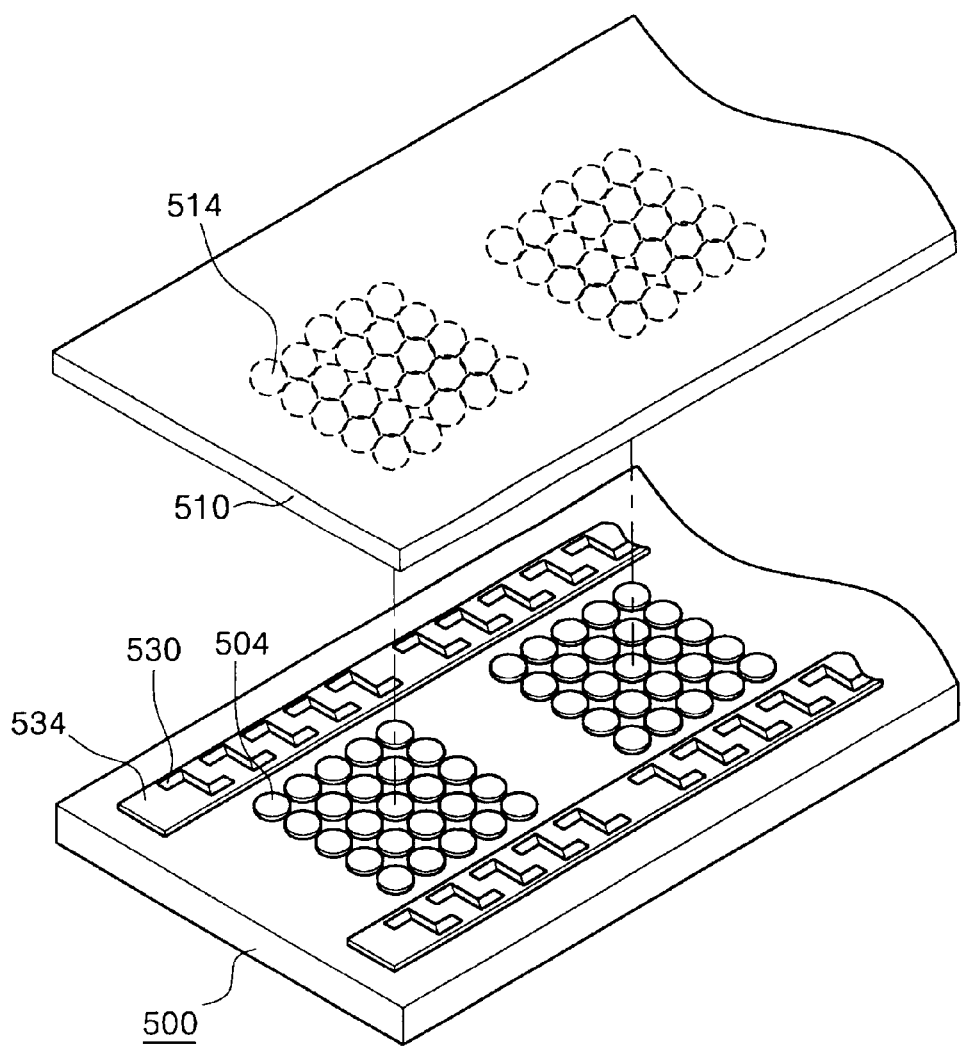
FIG. 11 illustrates an exploded perspective view of a ball grid array IC package according to a fourth embodiment of the present invention.

FIG. 11 illustrates an exploded perspective view of a ball grid array IC package according to a fourth embodiment of the present invention. Referring to FIG. 11, a ball grid array IC package according to a fourth embodiment of the present invention is constructed with a semiconductor chip 510 having a plurality of chip pads (not shown), conductive balls 514 (shown in phantom) electrically connected to the chip pads, a substrate 500 having ball lands 504 on which the conductive balls 514 are later mounted, a jig 534 attached to a peripheral part of the substrate 500 where the ball lands 504 are not formed, and metallic members 530 formed on the jig 534 for maintaining a uniform interval between the semiconductor chip 510 and the substrate 500 so as to change the shape of the conductive balls 514 into one of having the hourglass type.

Each of the metallic members 530 is formed a plurality of thin metal pieces, each having different heat expansion coefficients, the metallic members 530 being bent in accordance with a temperature variance.

A method of manufacturing a ball grid array IC package according to the fourth embodiment of the present invention is essentially the same of the third embodiment of the present invention. First, the conductive balls 514 are attached to the chips pads of the semiconductor chip 510. The ball lands 504 are formed on the substrate 500.

Subsequently, as shown in FIG. 11, the jig 534, on which the metallic members 530 are formed, is attached to a peripheral part of the substrate 500. An adhesive layer may be disposed between the substrate 500 and the jig 534 so as to strengthen the adhesive power between the substrate and the metallic members 530.

After the conductive balls 514 have been made to come into contact with the ball lands 504, thermal treatment is carried out on the above resultant structure using an infrared lamp (not shown). As a result of the thermal treatment, the metallic members 530 expand. In this case, the spherical conductive balls 514 are extended by the vertical expansion of the metallic members 530 to the extent of the interval between the semiconductor chip 510 and substrate 500 so as to change the connection into a shape having the hourglass features. Moreover, the jig 534 is detachable so as to be reused after the thermal treatment.

As mentioned in the above description of the present invention, an interval maintaining member is formed on a substrate or a semiconductor chip so as to secure a uniform interval between the semiconductor substrate and the semiconductor chip. Thus, the present invention is capable of extending the length of the respective conductive balls to the extent of the interval so as to manufacture an hourglass type IC package with greater precision and efficiency.

Moreover, the present invention does not require equipment for pulling upward a semiconductor chip in vacuum to provide an hourglass type conductive ball.

The foregoing embodiments are merely exemplary and are not to be construed as limiting the present invention. The present teachings can be readily applied to other types of similar or dissimilar apparatus. The description of the present invention is intended to be illustrative, and not to limit the scope of the following claims. Many alternatives, modifications, and variations will be apparent to those skilled in the art from an understanding of the invention as described and illustrated.

What is claimed is:

1. A ball grid array IC package comprising:
   a semiconductor chip having a plurality of chip pads;
   a substrate having ball lands;
   generally round conductive balls electrically connecting the chip pads to the ball lands; and
   an interval maintaining member for maintaining an interval between the semiconductor chip and the substrate comprising at least one metallic member, each metallic member comprising two metal portions having different coefficients of expansion causing the interval maintaining member to expand under heat, wherein the interval between the semiconductor chip and the substrate is formed by the interval maintaining member expanding under heat wherein the generally round conductive balls are extended into hourglass shape by the extension.

2. The ball grid array IC package of claim 1, wherein the interval maintaining member is attached to the substrate.

3. The ball grid array IC package of claim 1, further comprising an adhesive layer disposed between the semiconductor chip and the interval maintaining member.

4. The ball grid array IC package of claim 1, wherein the interval maintaining member is detachable.

5. The ball grid array IC package of claim 1, wherein the interval maintaining member may be expanded or contracted by application of heat.

6. A ball grid array IC package comprising:
   a semiconductor chip having a plurality of chip pads;
   a substrate having ball lands;
   conductive balls electrically connecting the chip pads to the ball lands; and
   a plurality of inflatable polymer balls containing at least one of expandable material and being positioned between the semiconductor chip and the substrate, wherein the volume of the polymer balls under the influence of heat increases due to the expansion of the expandable material contained inside the inflatable polymer ball causing the gradual separation between the semiconductor chip and the substrate at a uniform gap and shaping the conductive balls into a substantially hourglass shape.

7. The ball grid array IC package of claim 6, wherein the expandable material comprises at least one of air, gas, water, and oil.

8. A ball grid array IC package comprising:
   a semiconductor chip having a plurality of chip pads;
   a substrate having ball lands;
   hourglass type conductive balls electrically connecting the chip pads to the ball lands; and
   an interval maintaining member for maintaining a uniform interval between the semiconductor chip and the substrate comprising a polymer ball comprising a material selected from the group consisting of an epoxy based resin and a polyimide based resin, and wherein the polymer ball may be charged with a material selected from the group consisting of air, gas, water, and oil.

9. The ball grid array IC package of claim 1, wherein the interval maintaining member is a metallic member.

10. The ball grid array IC package of claim 1, the interval maintaining member further comprises:
    a jig which is detachable; and
    at least one polymer ball formed on the jig.

11. The ball grid array IC package of claim 1, the interval maintaining member further comprises:
    a jig which is detachable; and
    a metallic member formed on the jig.

12. The ball grid array IC package of claim 1, wherein the interval maintaining member is attached to the semiconductor chip.

13. A method of manufacturing a ball grid array IC package comprising the steps of:
    providing a semiconductor chip having a plurality of chip pads;
    forming a plurality of spherical conductive balls on the chip pads;
    providing a substrate including ball lands;
    attaching an expansive interval maintaining member to one of the semiconductor chip or the substrate;
    connecting the conductive balls to the ball lands; and
    expanding a volume of the interval maintaining member by carrying out a thermal treatment on the resulting structure so as to change the shape of the generally round conductive balls into one having hourglass features thereby causing the interval maintaining member to expand under heat, wherein the interval between the semiconductor chip and the substrate is formed by the interval maintaining member expanding under heat wherein the generally round conductive balls are extended into hourglass shape by the extension.

14. The method of claim 13, further comprising a step of disposing an adhesive layer between the interval maintaining member and the semiconductor chip or the substrate.

15. The method of claim 13, wherein the chip pads are formed on a peripheral part of the semiconductor chip and the interval maintaining member is formed at a central part of the semiconductor chip or the substrate.

16. The method of claim 13, wherein the chip pads are formed on a central part of the semiconductor chip and the interval maintaining member is formed at a peripheral part of the semiconductor chip or the substrate.

17. The method of claim 13, wherein the interval maintaining member is formed as a polymer ball.

18. The method of claim 17, the polymer ball is formed of an epoxy based resin or a polyimide based resin.

19. The method of claim 17, the polymer ball is charged with a material selected from the group consisting of air, gas, water, and oil.

20. The method of claim 13, wherein the thermal treatment is carried out at a temperature of between 200° C. and 250° C.

21. The method of claim 13, wherein the interval maintaining member further comprises a bimetal.

* * * * *